United States Patent
Reed

(10) Patent No.: US 10,265,768 B2
(45) Date of Patent: *Apr. 23, 2019

(54) METHOD OF PRODUCING METALLIC NANO PARTICLE COLLOIDAL DISPERSIONS

(71) Applicant: ZEROVALENT NANOMETALS, INC., Rochester, NY (US)

(72) Inventor: Kenneth J. Reed, Rochester, NY (US)

(73) Assignee: ZEROVALENT NANOMETALS, INC., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/978,099

(22) Filed: May 12, 2018

(65) Prior Publication Data

US 2019/0015896 A1 Jan. 17, 2019

Related U.S. Application Data

(63) Continuation of application No. 15/652,200, filed on Jul. 17, 2017, now Pat. No. 10,076,785.

(51) Int. Cl.
*B22F 9/24* (2006.01)
*B01J 13/00* (2006.01)
(Continued)

(52) U.S. Cl.
CPC ......... *B22F 1/0022* (2013.01); *B01J 13/0026* (2013.01); *B01J 35/006* (2013.01);
(Continued)

(58) Field of Classification Search
None
See application file for complete search history.

(56) References Cited

U.S. PATENT DOCUMENTS 6,197,366 B1 3/2001 Takamatsu et al.
7,335,245 B2 2/2008 He et al.
(Continued)

FOREIGN PATENT DOCUMENTS

WO WO-2015/082530 A1 * 6/2015

OTHER PUBLICATIONS

English translation of JP 2011032558-A, published Feb. 17, 2011.*
(Continued)

*Primary Examiner* — George Wyszomierski
(74) *Attorney, Agent, or Firm* — Tracy Jong Law Firm; Tracy P. Jong; Cheng Ning Jong

(57) ABSTRACT

The present process provides a method for synthesizing difficult to make oxide-free nanometals and such as Zn, Sn and Ti and alloys of the period 4 and 5 transition metal elements in a free and reduced state using a solution phase synthesis process. Also provided is a method for stabilizing their associated colloidal metal and alloy dispersions under kinetic control at modest temperatures (<95 degrees Celsius). A solution of an organic reducing agent containing at least two proximal nitrogen atoms is reacted with a separate solution containing one or more metal-organic salts dissolved in the same or different low molecular weight solvent as the reducing agent. The reaction products are stabilized with Lewis bases and Lewis acids and optionally can be concentrated by removing a portion of the volatile low molecular weight solvent by either the use of a partial vacuum or by chemical extraction into another phase.

13 Claims, 4 Drawing Sheets
(4 of 4 Drawing Sheet(s) Filed in Color)

(51) Int. Cl.
    *B22F 1/00*     (2006.01)
    *B22F 1/02*     (2006.01)
    *B01J 35/00*     (2006.01)
    *C30B 7/00*     (2006.01)

(52) U.S. Cl.
    CPC ............ *B01J 35/0013* (2013.01); *B22F 1/025* (2013.01); *B22F 9/24* (2013.01); *C30B 7/00* (2013.01); *C01P 2004/64* (2013.01)

(56) References Cited

U.S. PATENT DOCUMENTS

| | | | |
|---|---|---|---|
| 7,611,644 | B2 | 11/2009 | Shim et al. |
| 7,625,637 | B2 | 12/2009 | Kim |
| 7,749,300 | B2 | 7/2010 | Chretien et al. |
| 7,976,733 | B2 | 7/2011 | Chopra et al. |
| 8,088,485 | B2 | 1/2012 | Harutyunyan et al. |
| 8,404,160 | B2 | 3/2013 | Li et al. |
| 9,378,861 | B2 | 6/2016 | zinn et al. |
| 2008/0278181 | A1 | 11/2008 | Zhong et al. |
| 2009/0029148 | A1* | 1/2009 | Hashimoto .......... B01J 13/0043 428/323 |
| 2013/0288892 | A1 | 10/2013 | Lauterbach et al. |
| 2014/0003991 | A1* | 1/2014 | Zinn .................... B22F 1/0018 420/469 |
| 2014/0009545 | A1 | 1/2014 | Carmody |
| 2014/0033870 | A1* | 2/2014 | Tsay .................... B22F 1/0022 75/371 |
| 2014/0212497 | A1 | 7/2014 | Pikramenou et al. |
| 2015/0056426 | A1* | 2/2015 | Grouchko ............. C09D 11/52 428/208 |
| 2015/0099172 | A1 | 4/2015 | Rowe et al. |
| 2015/0203700 | A1* | 7/2015 | Lee ...................... B22F 1/0018 106/31.92 |
| 2017/0073538 | A1* | 3/2017 | Kawasaki ................ B22F 9/24 |
| 2017/0304805 | A1* | 10/2017 | Xu ...................... B01F 17/0007 |

OTHER PUBLICATIONS

Yu et al., Shape-controllable and versatile synthesis of copper nanocrystals with amino acids as capping agents, Nanoscale, 2015, 7, 8811, Accepted Apr. 8, 2015, DOI: 10.1039/c5nr00146c.

Usman et al., Synthesis, characterization, and antimicrobial properties of copper nanoparticles, International Journal of Nanomedicine 2013:8 4467-4479.

Zhang et al., Facile Fabrication of Ultrafine Copper Nanoparticles in Organic Solvent, Accepted: Mar. 24, 2009/ Published online: Apr. 10, 2009.

Hokita et al., High-Concentration Synthesis of Sub-10-nm Copper Nanoparticles for Application to Conductive Nanoinks, DOI: 10.1021/acsami.5b05542, ACS Appl. Mater. Interfaces 2015, 7, 19382-19389.

Magdassi et al., Copper Nanoparticles for Printed Electronics: Routes Towards Achieving Oxidation Stability, Materials 2010, 3, 4626-4638; doi:10.3390/ma3094626.

* cited by examiner

METHOD OF PRODUCING METALLIC NANO PARTICLE COLLOIDAL DISPERSIONS

PRIORITY CLAIM AND RELATED APPLICATIONS

This application is a continuation of application Ser. No. 15/652,200, now U.S. Pat. No. 10,076,785. This continuation application claims the benefit of priority from provisional application U.S. Ser. No. 62/363,591 filed on Jul. 18, 2016 and non-provisional application U.S. Ser. No. 15/652,200 filed on Jul. 17, 2017. Each of said applications is incorporated by reference in its entirety.

BACKGROUND OF THE PROCESS

1. The Field of the Process

This process relates to the synthesis and stabilization of metal-containing nanoparticle colloidal dispersions. More specifically, this process relates to an improved, low temperature, chemical solution phase synthesis of period 4 and 5 elements of the Periodic Table of the Elements and the stabilization of their associated colloidal metal and alloy dispersions.

2. Background Art

There is a considerable interest in the synthesis and chemical/physical properties of small metal particles and their alloys in the nano-domain where particle sizes are less than 100 nanometers. Application in the areas of photonics, medicine, coatings, additive manufacture and printable electronics are viewed as especially attractive commercial venues for these materials. Among the many synthetic routes to these materials, solution phase reaction is an especially straight-forward, economical and versatile method that also provides facile compositional materials engineering and particle size control. In one embodiment of this technique, metal particles are generated by the reduction of an organic metal salt in a solution phase (aqueous or organic) by a reducing agent with concurrent stabilization of the metal colloidal suspension with a chemical "capping agent" or stabilizer. Stabilizers can carry a formal electronic charge or not or can belong to a class of molecules called surfactants (composed of a lipophilic and hydrophilic moieties. Generally, capping agents, ligands, "ligate" or bond to the underlying metal with something less than a two electron bond.

A considerable amount of technical and patent literature has evolved around this technique with particular emphasis on the noble metals group (Platinum, Gold, Silver, Rhodium, and the like) as these materials, even in the nano-state, are resistant to aerial oxidation. Their electrochemical reduction potentials occur at large, positive voltages so the forward reaction $M^{2+} + 2e^- \rightarrow M^0$ is favored by a robust, spontaneous negative free energy change. For example the $E^0$ of Au is 1.692 volts and that of Pt is 1.18 volts.

Unfortunately, this is not the case for most of the period 4 and 5 transition metals such as Ti, Fe, Co, Ni, Cu, Zn, as the opposite situation prevails. Their $E^0$s are either small positive values or are negative and large in magnitude ($E^0$ Ti=−1.63 V, $E^0$ Ni=−0.25 V, $E^0$ Cu=+0.34 V and $E^0$ Zn=−0.76 V), which means the backward or oxidation reaction $M^0 \rightarrow 2e^- + M^{2+}$ is highly favored. Thus, it is difficult to find or synthesize these metals in a free and reduced state, as they are more commonly found as oxides due to the ease with which they combine with oxygen. The ubiquitous materials paint (i.e., $TiO_2$), sunscreen (i.e., ZnO), and red ($Cu_2O$) or black (CuO) are commonly encountered examples of these oxides.

In the preparation of fully reduced, referred to as "zero valent," nano-metals, it is common practice to use very high concentrations of polymeric ligands (molar ratios of >15:1 of organic stabilizer:metal) present in the metal cation reduction step to both sterically and electrostatically stabilize the resulting colloidal dispersion (to prevent agglomeration settling) and to provide a protective sheath that excludes, to varying extent, oxygen from the metal particle surface. This high concentration regime becomes more extreme when high particle loadings are desired—usually in the range that is equal to or greater than 20%. Herein lies the crux of the problem. Having stabilized the colloidal suspension with large quantities of complex organic molecules, the subsequent intended use of the material (conductive trace, Radio Frequency Identification (RFID) tags, electronic components, catalyst, coating, and the like) requires one to use extreme conditions of heat or light, long times or complex and involved reaction sequences to remove the protective sheath and render the metallic material reactive and useful for its intended purpose. This type of stabilization will be referenced herein as "thermodynamic stabilization" and it usually provides stability against settling and oxidation for periods of months. The opposite approach to this method could be called "kinetic stabilization" which requires better mixing, occurs with rapid reaction times and lower temperatures. Kinetic stabilization works for periods of days, allows for, and perhaps requires, subsequent chemical functionalization of the particle surface.

A very complete and recent review of copper and copper based nanoparticle synthesis with application to catalysis is given by Gawande et al. in *Chem. Rev.* 2016, 116, 3722-3811. Table 1 contains 107 entries detailing wet chemical methods (solution reaction chemistry) and covers: solvents (water, acetone, ethanol, proanediol for example), stabilizers (oleic acid, olylamine, polyvinyl pyrrolidone, polyethylene glycol, aerosol OT—a surfactant), reducing agents (hydrazines, sodium borohydride, ascorbic acid, glucose), copper chemical precursors (halides, acetates, nitrates, sulfates, acetylacetates) and thermal treatment conditions (usually ~100 degrees Celsius, for an hour or so). Additionally, the review of Tan and Cheong, *J. Nanopart Res* (2013)15:1537, discussed both copper and silver synthetic routes and focused exclusively on chemical reduction. They categorized the stabilizers as: polymers or surfactants (Triton X-100, Tween 20, PVP, PVA, Sodium Dodecyl Sulfate, etc.), acids (mercaptoacetic acid, sodium citrate, EDTA, stearic, cholic) amines (oleylamine, pheylenediamine, aminosilane), bromides (CTAB, DTAB, TTAB, TBAB), ligands (thiolates, sulfonates), alcohols (isopentanol, dodecanethiol) and silicates (Laponite).

Specific literature and patent examples of commonly used named stabilizers or capping agents include: PVP (Zhang et al. *Nanoscale Res Lett* (2009) 4:705-708 *"Facile Fabrication of Ultrafine Copper Nanoparticles in Organic Solvent"*), surfactants (discussed above), alcohols (Kawaska et. al. WO 2015129466 A1), diols and ether alcohols (Kurihara et al. U.S. Pat. No. 7,033,416 B2, Apr. 25, 2006), amines (U.S. Pat. Pub. No. 2015/0099172 A1, Apr. 9, 2015 "Synthesis of Metal Nanoparticles"), polyethylene amines (Quiintea et al. WO2015082530 A1, 2015), amino acids (Yu et al. *Nanoscale,* 2015, 7, 8811), carboxylic acids (Abe et al. JP 2011032558 A 20110207, 2011), and dithiacarbonates (Chopra, et al. U.S. Pat. No. 7,976,733B2). Zhong et al. in U.S. Pat. Pub. No. 2008/0278181A1 use a combination of surfactants, oleyic acid and oleyl amine as capping agents in the high temperature (>145 degrees Celsius) and extended time (~30 min) synthesis of claimed oxidation resistant copper nanoparticles 5 nm and greater. It should be noted that a separate isolation and re-suspension step was required to make the final dispersion. The inventors Alfred Zinn and P. Lu in U.S. Pat. No. 9,378,861 B2 uses an amine surfactant of carbon chain length C6-C18 and a ligand N,N'-dialkyl-ethylenedaimine to stabilize Cu nano particles with a poly disperse 1-10 nm size-frequency distribution. No direct sizing data are provided, other than a 100 nm scale transmission electron microscope (TEM), although the preferred size range is claimed to be 3-5 nm. These Cu nanoparticles are deemed to be metastable and have been previously formed in the presence of the alkylated ethylene diamine reducing agent at low temperature (<60 degrees Celsius). However, the particles sinter or "fuse" into a conductive circuit element in the 100-200 degrees Celsius temperature range and under pressure (<95 PSI) which is claimed to not cause additional heating. Thus a combination of both pressure and temperature are required for fusing the nanoparticles. Interestingly, short organic chain copper precursors (glycolates and separately copper acetate with formic acid and cyclohexylamine) have been described in RSC Adv., 2014, 4, 60144 by Wen-dong Yang, et al. however, these inks require very high temperatures (~220 degrees Celsius and 290 degrees Celsius) to achieve reasonable electrical conductivity.

The naturally occurring polymer chitosan (Usman et al. *Int. J. Nanomedicine* 2013:8 4467-4479) is an interesting and economical material but is difficult to use due to its limited solubility in most practical solvents. The use of negatively charged stabilizers such as carboxylic acids, poly acrylic acid, EDTA and the like is fraught with difficulties as the stabilizer will bind much more strongly to the starting metal cation (positively charged precursor) than it will to the final fully reduced metal, thereby thwarting the reduction process. This antagonistic and undesired effect can be overcome by the brute force application of extremely excessive reducing agent levels (greater than 10× the required stoichiometric amount) to bias the reaction towards the production of the desired product, zero valent metal.

Bi-dentate capping agents (not surfactants) feature two metal binding sites on the stabilizer molecule usually in close proximity (e.g., <4 atoms removed from each other). Prominent among these are the bis nitrogen materials 1,10 phenanthroline. In U.S. Pat. No. 7,335,245 B2 He et al. Honda Motor Feb. 27, 2008 "Metal and Alloy Nanoparticles" teaches multicomponent metal alloys invariably incorporate a noble metal, are supported on a carbonacious material, and are heated to several hundred degrees Celsius in a high temperature boiling solvent. Other bidentate containing materials featuring two nitrogens are bipyridine (BiPY) derivatives (U.S. Pat. Pub. No. 2014/0212497 A1 Pikramenou et al. Jul. 31, 2014 "Coated Nanoparticles" teaches a composite nanoparticle in which a first noble metal nanoparticle is functionalized by at least one type of metal complex and surfactant. The preferred metal complexes are those of Ir or Ru and combined with various derivatized bipyridines ("BiPY") and phenanthrolines). The limitations of these approaches are the obvious cost and scarcity of the precious metals involved and the financial and time expense of making "boutique" derivatized BiPY or phenanthroline compounds. It is not clear that the derivatized materials offer that much more benefit than the parent compounds. Off-the-shelf diamines, whose nitrogen atoms are located not immediately adjacent (as in 1,2) but in a 1,3 or 1,5 or even 1,7 disposition is described by H. Takamatsu in U.S. Pat. No. 6,197,366 B1 (2001) in for the formation of coatable, viscous, and homogeneous metal containing pastes. Very high temperature (>300 degrees Celsius) processing and long times (~5-10 minutes) were required to achieve pure metal film strips.

Nitrogen atom-containing molecules are not the only bi-dentate materials. The bi-dentate binding sites of a capping agent could feature two different atoms as is the case for the aminopropanol. Hokita et al. in *ACS Appl. Mater. Interfaces* 2015, 7, 19382-19389 describes the use of 1-amino 2-propanol and 1-amino 3-propanol as capping agents in the production of copper based inks. Very high levels of capping agent relative to the amount of metal copper were employed (a 10:1 molar ratio was cited) as were high levels of the reducing agent hydrazine (10:1 which is a 19 fold excess on an electron equivalent stoichiometric basis) which yielded upon sintering a fairly electrically resistive trace, 30 microohm-cm after a prolonged heating time of 15 minutes at high, 150 degrees Celsius, temperature. For comparison, the bulk resistance of unannealed copper is 1.68 microohm-cm. Other variants on the amino-alcohol capping agent theme are; Suguiyama et al. *J. of Mat. Sci. Materials in Electronics* 2016 who show that 2-amino-1-butanol has a capping agent has superior copper adhesion properties to polyimide films relative to the above cited amino propanols, Farraj et al., *Chemical Communications* (Cambridge, United Kingdom) 2015, 51(9) 1587-1590 who claim that 2-amino-2-methyl-1-propanol capped copper inks only require 140 degrees Celsius under a N2 blanket to cure on a flexible substrate and finally that a $N_2$ blanket is not required to prevent oxidation during the curing of a 3-dimethylamino-2-propanol or dimethyl ethanolamine capped copper ink as reported in by Kang et al. in *Repub. Korean Kongkae Taeho Kongbo* 2014 KR2014111070 A20140918.

Various strategies to mitigate the extent of oxidation for copper nanoparticles (in particular) are discussed in *Materials* 2010, 3, 4626-4638 by Magdassi et al. Essentially they involve putting a protective coating on the particles thereby making a core:shell structure. The copper coatings on these particles are: organic polymers (whose limitations have already been discussed), carbon or graphene, or an inert material such as silica or metal (typically binary combinations of Au, Pt, Ag, Pd). The precious metal shell approach to oxidation resistance suffers from obvious cost limitations. Specific core-shell patents are: Shim et. al. U.S. Pat. No. 7,611,644 B2 Nov. 3, 2009 which claims a precious metal shell technology; Chretien et. al. U.S. Pat. No. 7,749,300 B2 Jul. 6, 2010 claims a photochemical method of making a bi-metallic core-shell nanoparticle; Lauterbach et al. U.S. Pat. Pub. No. 2013/0288892 A1 Oct. 31, 2013 teaches core-shell nanoparticle synthesis under a reducing gas environment; Kim et al. U.S. Pat. No. 7,625,637 B2 Dec. 2009 teaches metal nanoparticles formed from low reduction potential metals (core shell structures with silver and palladium at the core and nickel shells) and finally Harutyunyan et al. U.S. Pat. No. 8,088,485 B2 claims that alumina or silica supported metal alloyed nanoparticles can be formed by heating a mixture of metal acetates in passivating solvents such as glycol ethers or 2-(2-butoxyethoxy) ethanol.

It should be noted that care needs to be taken in accepting the conclusions that fully reduced metal particles were synthesized in works where the identity of the nanoparticle has not been established, by either electron diffraction, x-ray diffraction or visible spectroscopy (usually by the observation of a 580 nm absorption peak in the case of copper, see, G. Mie Ann. *Phys* (Liepzig) 1908, 25, 377). False product identification may be a problem when sodium borohydride is used as the reducing agent, as it is well known that the borides $CrB2$, $Co_2B$ and $Ni_2B$ and by extension CuB, are readily produced by this reducing agent. Subsequent sintering will produce a broate or boric oxide coating which is a very good electrical insulator.

Metal ink formulations using aliphatic alcohols that are sinterable by heat or light are described for wet coating applications, Li et al. in U.S. Pat. No. 8,404,160 B2 Mar. 26, 3013 or for jetting applications which use a combination of alcohols, diols and glycols and require specific surface tension and viscosity values, see M. Carmody in U.S. Pat. Pub. No. 2014/0009545 A1 Jan. 9, 2014. Again the limitation herein is the need for a high power laser to sinter the copper ink that has been previously applied to a surface, into a highly electrical conducting pattern or trace.

Despite the advances in the art, there is clearly a need for stabilization strategies and chemistries that facilitate the use of the as-made metal nanomaterials that does not require large quantities of complex organic polymeric molecules or excessive amounts of reducing agents while still providing high suspension density materials with good low temperature sintering properties that are reasonably electrically conductive.

SUMMARY OF THE PROCESS

The present process provides a method for synthesizing and stabilizing difficult to make oxide-free metal in a free and fully reduced state using a facile solution phase synthesis process that does not require de-aeration. Also provided is a method for stabilizing the associated colloidal metal dispersion under kinetic control at modest temperatures (<80 degrees Celsius). A solution of an organic reducing agent containing at least two proximal nitrogen atoms, either neat or in a solvent is reacted with a separate solution containing one or more metal-organic salts dissolved in the same or different low molecular weight solvent as the reducing agent and form a charge transfer Ligand to metal complex. This metal cation CT complex stabilizes the metallic reagent against aerial oxidation. The pure metal reaction product nanoparticle is stabilized prior to the reduction step with the addition of a bi or polydentate Lewis base that preferentially binds to the reduced. Optionally, after the reduction step, additional stabilization may be effected with the addition of one or more Lewis acids. The metal or alloy product may, optionally, be concentrated by removing a portion of the volatile low molecular weight solvent by either the use of a partial vacuum or by chemical extraction into another phase. In certain embodiments, with high reactant suspension densities, there is no subsequent concentration or product processing (distillation, filtration, or extraction). This metal nanoparticle reaction is then called a "one-pot" synthesisl.

It is an object of this process to kinetically stabilize for a useful period of time, colloidal metal nanoparticle dispersions with small molecule Lewis and Bronsted bases such as mono, bi and tri dentate amines and aminoalcohols. These small molecule, non-polymer capping agents or stabilizing agents can be employed at relatively low levels with respect to the metal, for example, less than 4:1 molar ratio of stabilizer to metal and in some cases as low as 1:4. In addition to facilitating their removal (low temperature and short times), these low levels of stabilizer greatly improve the economics of producing the dispersion in addition to removing any concerns of introducing aerial oxidation into the dispersion work-up.

It is an additional object of this process to provide Lewis acid stabilizers such as boric acid and alkyl or aryl borates as adjuvant stabilizing molecules, administered post nanoparticle formation, to further extend the period of stability and facilitate subsequent chemical and physical manipulation of the colloid. Both adjuvant and initial capping agents alone or in combination can be used in a manner after the reduction step to terminate particle growth and thereby control final nanoparticle size. This two stage (dual) stabilization strategy provides an alternative to, and obviates the need for, thermodynamic stabilization using polymeric and large molecule chemistry at high concentrations (greater than a 10:1 organic:metal atomic ratios).

Additionally, the adjuvant Lewis acid chemistry provides protection against aerial oxidation and facilitates sintering (by lowering surface tension) and melting of the particles when exposed to sufficient heat (thermal) or light (photonic) curing. This aids in the production of high thermally and electrically conductivity coatings or patterns.

A further object of this process is to enable the synthesis of difficult to make oxide-free metal nanometal using appropriate aqueous and non-aqueous aminoalcohol solvent systems.

It is also an object of this process to characterize a "one pot" synthesis in which the ancillary chemical steps needed to isolate and clean up the synthesized post reaction product are eliminated by the judicious choice of chemical reaction media (solvents), chemical reactants and stabilizing chemistry.

Whereas there may be many embodiments of the present process, each embodiment may meet one or more of the foregoing recited objects in any combination. It is not intended that each embodiment will necessarily meet each objective. Thus, having broadly outlined the more important features of the present process in order that the detailed description thereof may be better understood, and that the present contribution to the art may be better appreciated, there are, of course, additional features of the present process that will be described herein and will form a part of the subject matter of this specification.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In order that the manner in which the above-recited and other advantages and objects of the process are obtained, a more particular description of the process briefly described above will be rendered by reference to specific embodiments thereof which are illustrated in the appended drawings. Understanding that these drawings depict only typical embodiments of the process and are not therefore to be considered to be limiting of its scope, the process will be described and explained with additional specificity and detail through the use of the accompanying drawings in which.

PARTICULAR ADVANTAGES OF THE PROCESS

Figure 1A:
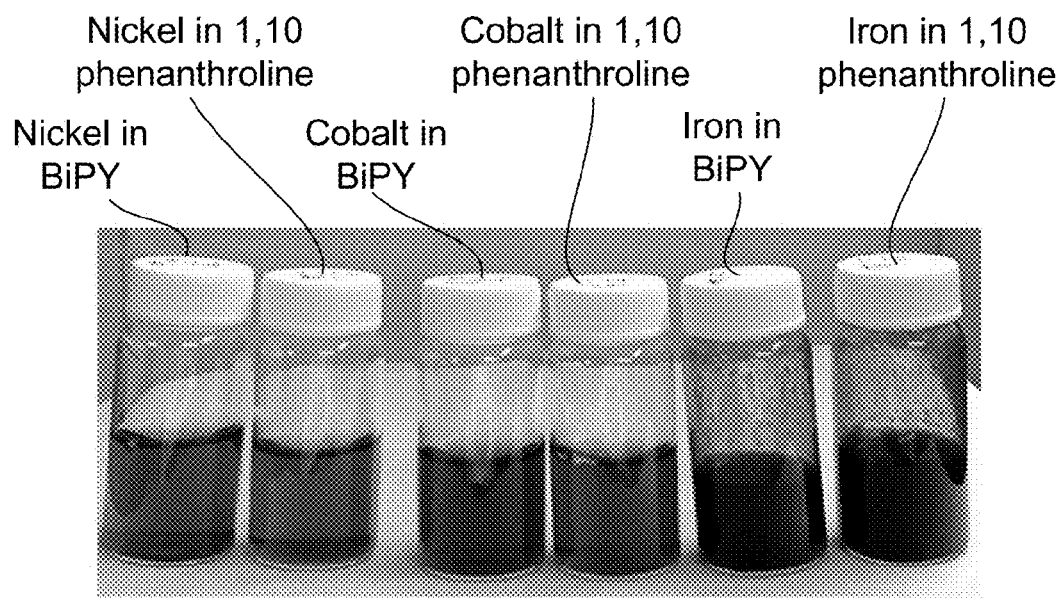
FIG. 1A depicts pairwise photos of anhydrous metals makes Ni, Co, Fe, first with 1.1:1 Bipy and separately 1,10 phenanthroline.

The present process provides a method for synthesizing difficult to make oxide-free nanometals and such as Zn, Sn, Sb and Ti and alloys of the period 4 and 5 transition metal elements in a free and reduced, zero valent state.

The present process produces metal and metal alloy compositions that are essentially solvent or continuous phase-free (90% metal).

The present process provides for the use of preferred reactants that form charge transfer complexes with the Lewis base capping agents thus eliminating the need for auxiliary solvents and enabling high suspension density metal colloids.

The present process kinetically stabilizes colloidal metal and metal alloy nanoparticle dispersions with small molecule Lewis and Bronsted bases such as mono, bi and tri dentate amine or aminoalcohols or capping agents such that the process minimizes or eliminates the ancillary chemical steps needed to isolate and clean up the synthesized reaction products.

The present process reduces the quantity of non-polymeric capping agents and stabilizing agents used in the production of high suspension density materials with good low temperature sintering properties to lower than a 4:1 molar ratio of stabilizer to metal.

The present process provides adjuvant molecules, commonly, Lewis acids, such as boric acid or alkyl borates administered post nanoparticle formation, to further extend the period of stability and facilitate subsequent chemical and physical manipulation of the colloid such as sintering.

The present process provides a post reduction step to terminate particle growth and thereby control final nanoparticle size.

The present process identifies di amino reducing agents that enable the formation of nanoparticles of less than 3 nm in geometric diameter.

The present process provides an alternative to, and obviates the need for, thermodynamic stabilization which relies on polymeric and large molecule chemistry used in high concentrations (usually greater than a 10:1 organic:metal atomic ratios).

The present process provides protection against aerial oxidation and facilitates sintering and melting of the metal or alloy particles when exposed to heat (thermal) or light (photonic) curing, an advantage in the production of high thermal and electrical conductivity coatings or patterns.

The use of kinetic stabilization as opposed to thermodynamic stabilization eliminates the need for extreme conditions of heat or light, long times or complex and involved reaction sequences to remove the protective sheath and render the metallic material reactive and useful for its intended purpose.

Definitions of Terms Used in this Specification

As used in this specification, the term nanoparticles shall mean particles that have at least one dimension that lies between 1 and 100 nanometers.

As used in this specification, the term low molecular weight solvent shall mean a solvent with a molecular weight of less than 120 atomic mass units, amu.

As used in this specification, the term metal organic salt shall mean compounds consisting of metal ions or cluster coordinated to organic ligands displaying intense colors (charge-transfer complexes) which form two-, or three-dimensional structures.

As used in this specification, the term quenching agent shall mean a chemical which tends to severely inhibit or stop the reaction between two or more other chemicals.

As used in this specification, the term Lewis acid shall mean an electrophilic compound that can accept a pair of electrons and form a coordinate covalent bond.

As used in this specification, the term Lewis base shall mean a chemical or compound that donates a pair of electrons to a metal, or optionally, to a Lewis acid.

As used in this specification, the term capping agent shall mean the same as a stabilizing agent and is a chemical or compound that adsorbs to nanoparticle surfaces and stabilizes them from agglomeration or aggregation.

As used in this specification, the term reducing agent shall mean is an element or compound that loses (or "donates") one or more electrons to another chemical species in a redox chemical reaction. Organic reducing agents contain organic compounds or elements.

As used in this specification, the term adjuvant molecule shall mean molecules or agents that modifies the effect of other agents.

As used in this specification, the term eutectic melting point composition means at least two metals in combination that have a melting point lower than either component metal.

As used in this specification, the term alloy means a spatially and chemically homogeneous composition of two or more metals.

As used in this specification, the term core-shell composition means a homogeneous composition of two or more metals featuring discrete phases of high metal composition.

As used in this specification, the term facile solution phase synthesis means a simple (i.e., no complicated equipment), low temperature (<60 degrees Celsius), and rapid synthesis (minutes not hours) that does not require extensive work-up (separations, filtration) of the reaction products.

DETAILED DESCRIPTION OF A PREFERRED EMBODIMENT

The term "about" is used herein to mean approximately, roughly, around, or in the region of. When the term "about" is used in conjunction with a numerical range, it modifies that range by extending the boundaries above and below the numerical values set forth. In general, the term "about" is used herein to modify a numerical value above and below the stated value by a variance of 20 percent up or down (higher or lower). The present process provides a method for synthesizing difficult to make oxide-free nanometals and such as Zn (zinc), Sn (tin) and Ti (titanium) and alloys of the period 4 and 5 transition metal elements (referring to the standard Periodic Table of Elements) in a free and reduced state. These metallic nanoparticle or nano-alloy colloidal dispersions can be generated by the reduction of an organic metal salt in a solution phase (aqueous or organic) by a reducing agent with concurrent stabilization of the metal colloidal suspension with a chemical "capping agent" or stabilizer. This process reduces the quantity of non-polymer capping agents and stabilizing agents used in the production of high suspension density materials with good low temperature sintering properties to as low as 4:1 molar ratio of stabilizer to metal. That is to say one mole of metal will have bound to it four or fewer moles of stabilizer, or one metal molecule to four stabilizer molecules on a molecular basis.

In one embodiment, metallic nanoparticles or nano-alloys can be synthesized by reacting an organic reducing agent either neat or dissolved in a low molecular weight solvent (<120 amu) with a separate solution comprising at least one metal-organic salt dissolved in a low molecular weight solvent until the organic reducing agent is exhausted. The organic reducing agent preferably has at least two nitrogen atoms disposed in close spatial proximity to one another. In this sense, close spatial proximity means having less than four atoms separating the two nitrogen atoms in the molecule. Hydrazine $N_2H_4$ is a preferred reducing agent as it produces $H_2$ (the reducing agent) and $N_2$ (which escapes into the atmosphere). Typically, the reducing agent concentration is twice to four times the stoichiometric amount needed to reduce the metal completely as there are losses of $H_2$ into the atmosphere.

The reaction may occur under kinetic control at a temperature less than about 80 degrees Celsius, preferably less than about 60 degrees Celsius and more preferably less than about 40 degrees Celsius. The reaction temperature is preferentially kept low so as to not volatilize the low molecular weight reagents out of the reaction zone. The boiling point of methanol is 64.7 degrees Celsius while that of ethanol is 78.4 degrees Celsius.

A Lewis base (an electron donating molecule) used as a stabilizer may be present during the reduction step or added to the reaction shortly after exhaustion of the reducing agent. The time at which this stabilizer is added after the reduction has ended, will influence the final particle size. If the Lewis base stabilizer is present during the reaction, its level and binding strength will also affect the final particle size. Higher stabilizer concentrations and stronger particle-binding energy of the stabilizer to the particle will tend to produce smaller sized final particles. The preferred Lewis bases have at least two nitrogen atoms in close proximity to each other (close being defined as less than four atoms removed) and are usually bi-dentate. Specific classes of Lewis bases are organic diamaines such as 2,2'-bipyridine; 1,10-phenanthrroline, N, N dimethyl formamide, urea, phenidone and derivatized phenidones, pyridine, substituted pyridines, ortho-phenylenediamines, aminoalcohols such as ethanolamine, 2-amino phenol, 8'-hydroxyquinoline and tri-amines such as melamine or combinations of these chemicals. Of the amino acids, arginine, and histadine perform the best as stabilizers at low concentrations (~2:1 stabilizer to metals ratio).

The preferred reducing agents have similar nitrogen atom disposition as the Lewis bases and in fact also act to some limited degree as stabilizing agents.

While the Lewis base is not affected by the reducing agent and therefore can be present in the reduction step, certain Lewis acids or adjuvant stabilizers, on the other hand, will react vigorously with most reducing agents, most notably the alkyl or aryl borates. Curiously, boric acid is the exception to this rule. Thus, this second stage of the stabilization process must come after the reducing agent is exhausted. The Lewis acid can be a boric acid or an organic (alkyl) borate, or a combination of these.

If desired, the product can be concentrated by removing a portion of the volatile low molecular weight solvent to produce a metallic nanoparticle or nano-alloy colloidal dispersion. The solvent can easily be removed by gentle heating in a partial vacuum, chemical extraction into another phase, ultrafiltered or diafiltered to move unwanted volatiles or even complexed into the organic layer surrounding the metal particles. High percent solids (that is, metal and metal alloy compositions that are essentially solvent or continuous phase-free (90% metal) can be achieved most readily by solvent extraction of the metal particles into an organic phase of very low volume.

Other parameters that can be manipulated for controlling particle size, in addition to a post reduction step that terminates of quenches particle growth are; temperature (high temperatures tend to produce larger particles) and stabilizer concentration (low stabilizer concentrations i.e. <1.5:1 stabilizer molecule to metal molecular tend produce larger particle sizes).

The present process provides adjuvant molecules, administered post nanoparticle formation, to effect particle size control and to further extend the period of stability of the colloidal dispersion. Certain Lewis acids act as these adjuvants, such as for example, boric acid or alkyl or aryl borates, and also facilitate subsequent chemical and physical manipulation of the colloid such as facile (low temperature, i.e., <150 degrees Celsius) sintering and forming highly conductive electrical patterns or traces.

The metal organic salt can be one or more metals selected from the group consisting of metals from the 4th (first row transition metals) and 5th period of the Periodic Table. The metal organic salt can be a precursor salt of a metal alloy such as antimony, tin, aluminum and combinations thereof. The organic portion of the salt can be a salt such as an acetate, formate, alkoxide, citrate and combinations of these salts. Formates are preferred as they are highly water soluble and the residual formate ion can act as a reducing agent during the sintering step, thereby protecting the work from aerial oxidation.

The organic reducing agent can be a reducing agent such as a hydrazine, aquated hydrazine, derivatized hydrazine, phenidone, derivatized phenidone, ortho-phenylenediamine or combinations of these.

The low molecular weight solvent can be water, methanol, ethanol, methoxy-propanol, 1-amino 2-propanol, 1,2-di-amino propane, 1-amino 3-propanol and combinations of these. The amino alcohols help to chelate the metal cation and prevent it from forming an oxide during reactions that are carried out in water. Otherwise non-aqueous solvent systems must be employed. Low molecular weight solvents are in general preferred as they can be removed from the reaction at modest temperatures and under reduced atmospheric pressure.

The present process kinetically stabilizes colloidal metal and metal alloy nanoparticle dispersions with small molecule Lewis and Bronsted bases such as mono, bi and tri dentate amine ligands such that it minimizes or eliminates the ancillary chemical steps needed to isolate and clean up the synthesized post reaction products. Dispersions can be formulated that are >20% solids in a "one pot" reaction where no additional filtration or physical separation methods are required. Thus, the present process provides an alternative to, and obviates the need for, thermodynamic stabilization using polymeric and large molecule chemistry at high concentrations (greater than a 10:1 organic:metal atomic ratios). It also provides protection against aerial oxidation and facilitates sintering and melting of the particles when exposed to heat (thermal) or light (photonic) curing, an advantage in the production of high thermal and electrical conductivity coatings or patterns. The use of kinetic stabilization as opposed to thermodynamic stabilization eliminates the need for extreme conditions of heat or light, long times or complex and involved reaction sequences to remove the protective sheath and render the metallic material reactive and useful for its intended purpose.

Example 1

Into three separate 20 ml scintillation vials were introduced 1 mmole of nickel acetate tetra hydrate (273.72 mg), 1 mmole of cobalt acetate tetrahydrate (254.16 mg) or 1 mmole of ferric chloride hexahydrate (270.3 mg). The powders were solubilized by the addition of 7 ml of hot 18M Ohm deionized water. Additionally, the ferric chloride (yellow orange color) was converted to iron acetate (red color) by the addition of 3 mmoles of sodium acetate (246.1 mg). Then 1.1 mmole of BiPY (171.8 mg) in 7 ml of hot ethanol were introduced into each of the metal acetate solutions. The subsequent metal cation reduction was carried out under an argon gas blanket by the addition of 0.5 ml of 35% hydrazine (in water) solution (5 mmole). The experiment was repeated with 1.1 mmole of 1,10 phenanthroline (198.13 mg) substituting for the BiPY.

Figure 1B:
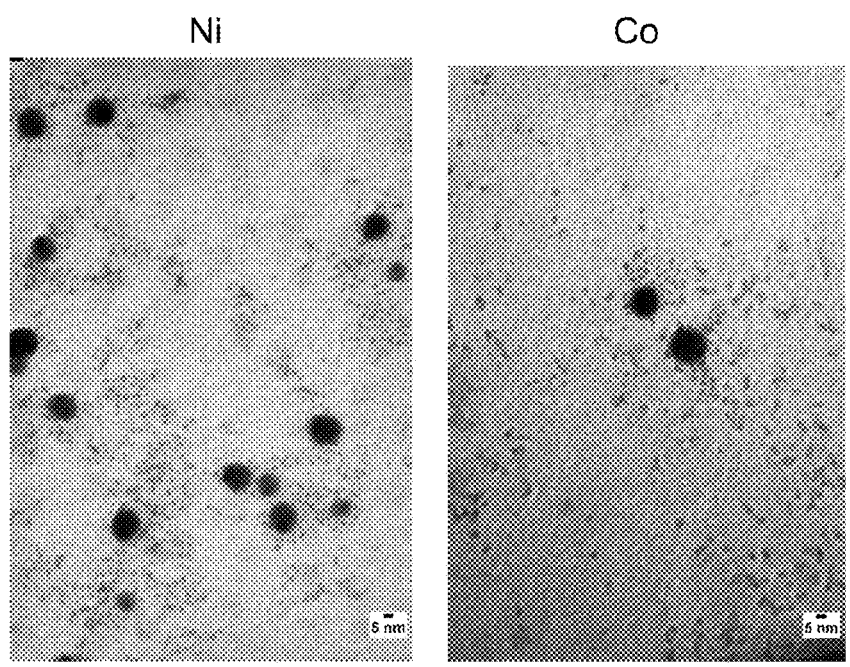
FIG. 1B depicts TEM of Ni and Co makes.

FIG. 1A is a pairwise photo comparison of these metals makes (Ni, Co, Fe, first with 1.1:1 BiPY and then 1,10 phenanthroline. There does not appear to be any significant difference between the efficacy of stabilization of these two stabilizers. Translucent dispersions of blue, green and red colors were produced. FIG. 1B depicts TEM of Ni and Co makes showing relatively small nanometer-size particles.

Example 2

Figure 2:
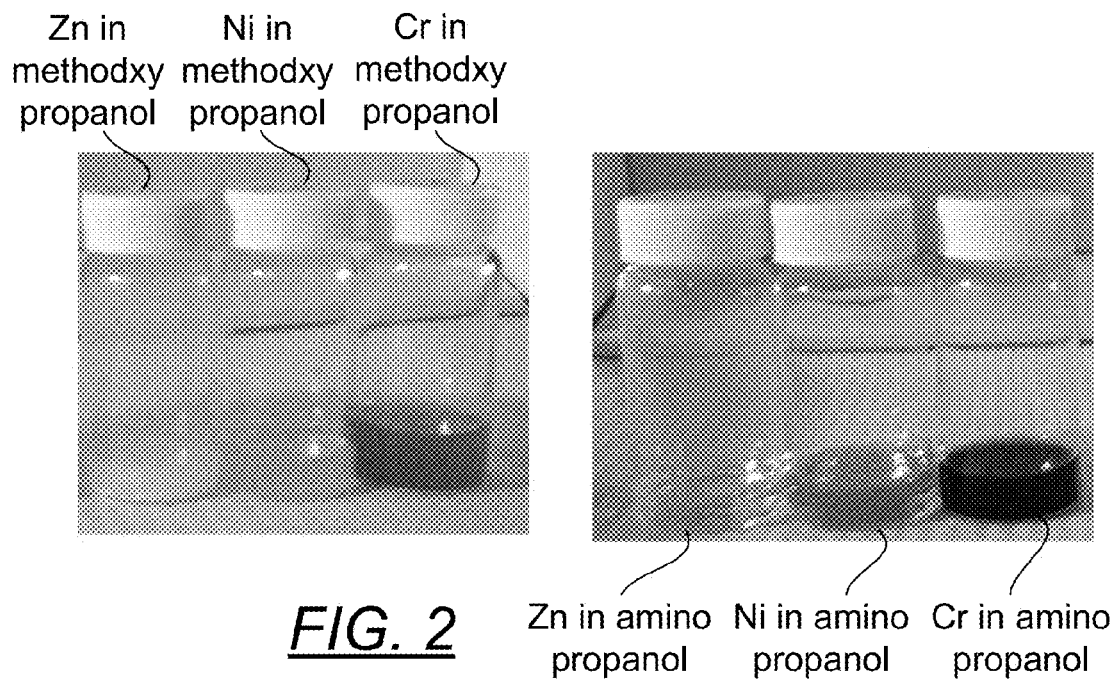
FIG. 2 depicts Zn, Ni, and Cr colloidal dispersions made in methoxy propanol then separately in 1-amino-2-propanol.

Due to the propensity to form oxides, reduced metal dispersions of zinc and chromium are difficult to produce and may be dependent upon the nature of the solvent the metal precursors are dispersed in. Methoxy-propanol was used to solubilize separately zinc acetate (clear solution), nickel acetate (pale blue solution) and chromium acetate (black purple solution). To each of these was added an excess of the stabilizer BiPY. Charge transfer complexes were formed that only intensified the original color. As seen in the first three vials in FIG. 2, the addition of an excess of hydrazine monohydrate caused the zinc complex to go milky white (ZnO), the nickel complex went milky blue (nickel oxide) and the chromium complex to go a murky dark purple (oxide formation). Thus, this solvent is not well suited to prepare the reduced metals of these materials. This experiment was repeated replacing the methoxy-propanol with 1-amino-2-propanol. Very translucently clear nanoparticle dispersions (next three vials) were formed with the amino propanol for all three metals. We speculate that the amino-propanol is a much better chelating agent for the cationic and reduced metals thereby thwarting the oxide formation reaction.

Figure 3:
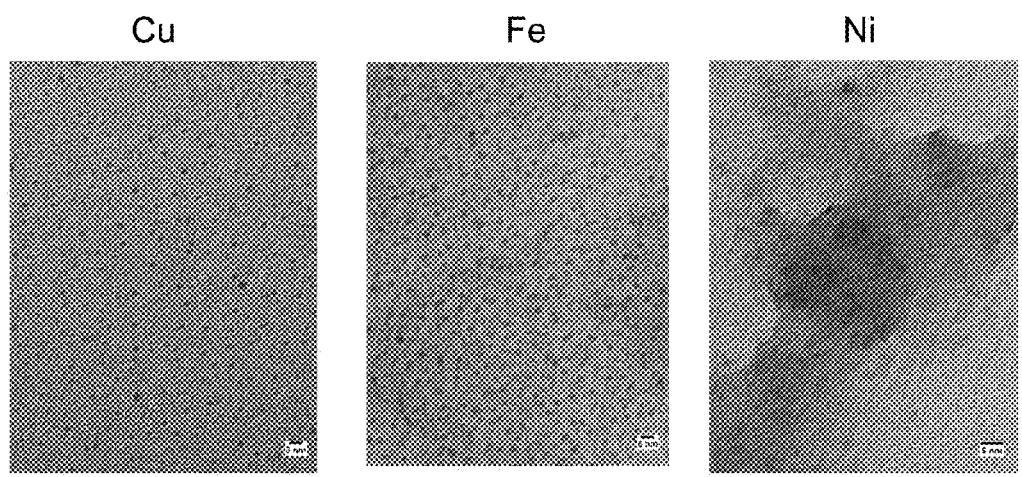
FIG. 3 depicts the transmission electron microscope (TEM) of Cu, Fe and Ni particles 2:1 stab:metals in ET and no EG.

FIG. 3 depicts the Cu, Fe and Ni metals described in Examples 1 and 2 repeated at a stabilizer to metal ratio of 2:1 in pure ethanol and TEMs of these metals indicate a very small particle size <5 nm.

Example 3

Figure 4:
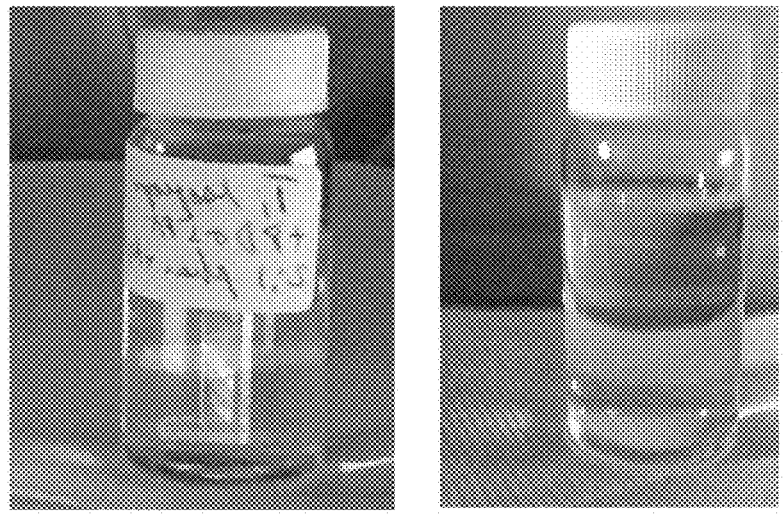
FIG. 4 depicts titanium isopropoxide reduced to Ti nanoparticles made in water, propane diol, isopropyl alcohol, and using the stabilizer 1,10 phenanthroline (ratio of 2:1 relative to copper). The second vial is the same reaction carried out without any water solvent and replacing propane diol with propane glycol monomethylether. Again, Ti nanoparticles are produced.

FIG. 4 depicts the formation of titanium nanoparticles. 0.5 mmole (142.11 mg) of titanium isopropoxide (anhydrous) were dissolved in 6 ml of hot 18M Ohm deionized water in a 20 scintillation vial. To this was added 1 mmole (198.13 mg) of 1,10 phenanthroline dissolved in 2.25 ml of propane diol, 4.5 ml of isopropanol and 6 ml of 18 MOhm deionized water. The reduction was carried out by adding 0.5 ml (6.4 mmole) of 64% $N_2H_4:H_2O$. As seen in the left panel of FIG. 4, a clear dispersion of titanium nanoparticles scatters light in a tightly focused beam (indicating a somewhat uniform and small particle size. This dispersion was stable for more than two months. In the right panel of FIG. 4 is a similar titanium isopropoxide make using BiPY to replace the 1,10 phenanthroline and substituting propane glycol monomethyl ether for the water on the stabilizer side. Again a similar good and small particle dispersion of titanium nanoparticles was made.

Example 4

Figure 5:
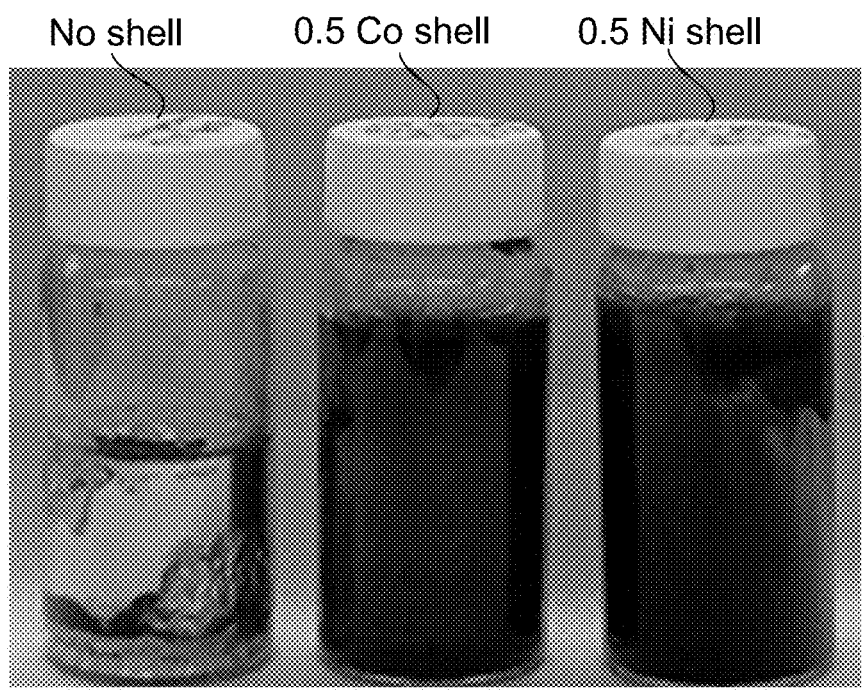
FIG. 5 depicts quench experiment Cu core no stabilizer, no shell, 0.5 mm Co shell and 0.5 mm Ni shell.

Metal core and metal shell particles were made without the presence of a stabilizer. One mmole of copper acetate (200 mg) dissolved in warm 18M Ohm deioinized water was reduced by 0.5 ml of a solution containing 35% $N_2H_4$ (3.4 mmole) in the absence of any stabilizer. The leftmost vial in FIG. 5 clearly shows a homogeneous copper plating of the vial interior. This occurred after ten minutes or so. Thus, the reducer is acting somewhat as a (poor) stabilizer. The experiment was repeated with 0.5 mmole (127.08 mg) of a cobalt acetate tetrahydrate compound dissolved in Di water being introduced to the reduced copper immediately after the initial reduction. An additional 0.5 ml of hydrazine solution was then introduced to the mixed metals vial. The second vial in FIG. does not show evidence of copper plating out on the vial walls which is interpreted to mean that some cobalt grew over the copper and inhibited it from reacting with the vial walls. This experiment was repeated again with 0.5 mmole of nickel acetate tetrahydrate substituted for the cobalt. Again, inhibition of copper nanoparticle plating out i.e., mirroring was observed and interpreted in the same manner as before. Some form of copper core-nickel shell structure had been synthesized and it inhibited this plating.

Example 5

Figure 6:
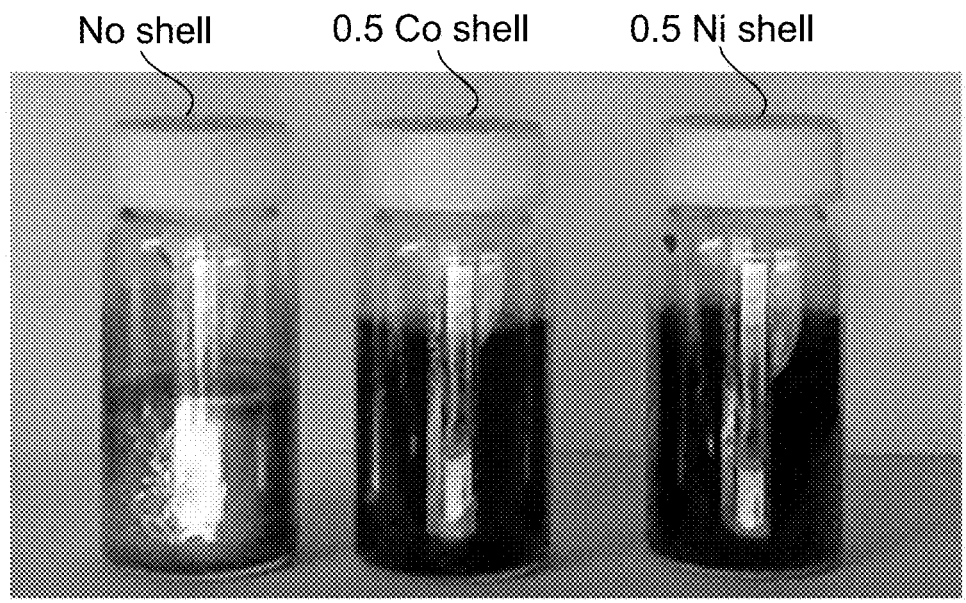
FIG. 6 depicts alloy experiment Cu core stabilized with urea, no shell, 0.5 mm Co shell, and 0.5 mm Ni shell.
Figure 7:
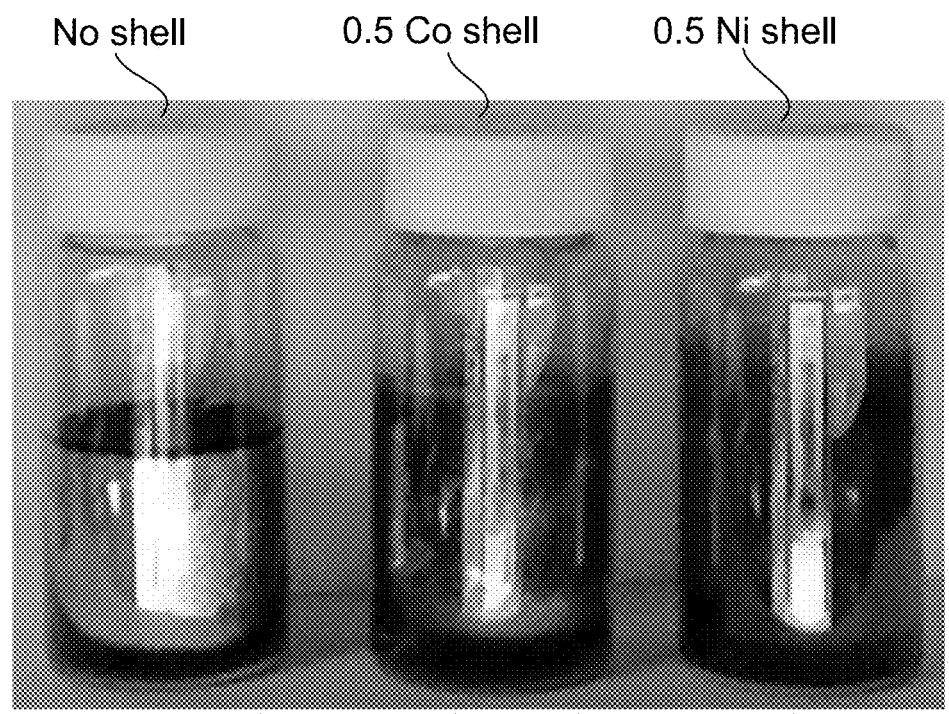
FIG. 7 depicts alloy experiment Cu core with 1,10, phenanthroline, no shell, 0.5 mm Co and 0.5 mm Ni shell.

Metal core and metal shell particles made in the presence of 1.1 mmoles (73.4 mg) of urea stabilizer. The same three part experiment as described in Example 3 (no shell, cobalt shell, nickel shell) was repeated only this time in the presence of a weak stabilizer, urea. As is seen in FIG. 6, the metal shells confer some protection to the copper core but there is some evidence of copper printing out a pure coating on the vial interior. We surmise that the urea stabilizer might be interfering with or inhibiting to some degree the metal shell formation.

Example 6

Metal core and metal shell particles were made in the presence of a good stabilizer, 1,10-phenanthroline. The experimental examples of Example 3 and 4 were repeated only this time in the presence of a strong stabilizer, 1,10-phenanthroline. 1.1 millimoles (198.13 mg) were used in each case: no shell, Co shell, Ni shell. It is evident in FIG.

7 that the stronger stabilizer has caused more copper plating out than in the case of the weaker urea stabilizer. This seems reasonable if the stabilizer is in some way inhibiting the integration of metal shell material covering the copper core.

Thus, there is provided a stable, fully reduced metallic nanoparticle-containing colloidal dispersion with a uniform and mean particle size less than about 10, preferably less than about 5 nm and most preferably less than about 3 nm synthesized by a facile, low temperature solvent process which comprises the basic steps of: initially forming a metallic salt charge transfer complex (CT complex) of an amino alcohol or diamine moiety with a metallic salt; then reacting, sometimes to completion, the CT complex with a solution comprising a two or three nitrogen atom-containing organic reducing agent to form metallic particles; and finally stabilizing the metallic particles with aniline or a bi-dentate nitrogen atom containing stabilizer (Lewis base) to form the stable, fully reduced metallic nanoparticle-containing colloidal dispersion. In this process, the CT complex results from the reaction of a metallic formate, acetate or citrate salt dissolved in ethanolamine and a 1,2 or 1,3-aminopropanol or diamine. The two or three nitrogen atom containing reducing agent is selected from the group consisting of diethylenetriamine, 1,2-diaminocyclohexane, hydrazine, derivatized hydrazine molecule or phenidone-like molecule. The bi-dentate nitrogen or hetero atom-containing amine stabilizer is selected from the group comprising dimethyl glyoxime, 2,2'-bipyridine, 1,10-phenanthroline, ortho-phenylenediamine, 1,2-diaminocyclohexane, 1,4-diamino butane, urea, 8-hydroxyquinoline, substituted urea, and combinations thereof. Preferably, the process is a one-pot process.

In one embodiment, the step of forming the CT complex comprises a reaction of a metallic formate, acetate or citrate salt dissolved in a diamine, 1,2 or 1,3-diamino propane or 1,2-diaminocyclohexane.

In one embodiment, the process further comprises the step of concentrating the stable, fully reduced metallic nanoparticle-containing colloidal dispersion by removing at least a portion of a volatile low molecular weight solvent.

In one embodiment, the bidentate organic amine or diamine is present during the reduction. In another embodiment, the bidentate organic amine or diamine is introduced post reduction.

In one embodiment, a Lewis acid such as a boric acid or organic borate is introduced post reduction. In another embodiment, the solvent is removed by partial vacuum distillation, ultrafiltration, chemical extraction into another phase or complexation.

In one embodiment, the steps of reacting, exhausting, stabilizing and concentrating occur at a temperatures less than 60 degrees Celsius.

In one embodiment, the reducing agent has at least two nitrogen atoms that are in spatial proximity of less than four atoms preferably adjacently located.

In one embodiment, the low molecular weight solvent is a low molecular weight solvent selected from the group consisting of water, methanol, ethanol, ethanolamine, mono, di and tri-ethanol amine, methoxy-propanol, 1-amino 2-propanol, 1-amino 3-propanol, 1,2-diamino propane, 1,3-diamino propane and combinations thereof.

In one embodiment, the dispersion is deposited on a substrate wherein the dispersion is deposited on a substrate wherein the substrate-dispersion combination form one or more coatings for an optical element or a barrier to inhibit oxidation (rust) or an electrically or thermally conductive component selected from the group comprising an antenna, waveform, RFID, and active component of an electrical device.

The process has been described in detail with particular reference to certain preferred embodiments thereof, but it will be understood that variations and modifications can be effected within the spirit and scope of the process.

The detailed description refers to the accompanying drawings that show, by way of illustration, specific aspects and embodiments in which the present disclosed embodiments may be practiced. These embodiments are described in sufficient detail to enable those skilled in the art to practice aspects of the present process. Other embodiments may be utilized, and changes may be made without departing from the scope of the disclosed embodiments. The various embodiments can be combined with one or more other embodiments to form new embodiments. The detailed description is, therefore, not to be taken in a limiting sense, and the scope of the present process is defined only by the appended claims, with the full scope of equivalents to which they may be entitled. It will be appreciated by those of ordinary skill in the art that any arrangement that is calculated to achieve the same purpose may be substituted for the specific embodiments shown. This application is intended to cover any adaptations or variations of embodiments of the present process. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present disclosed embodiments includes any other applications in which embodiments of the above structures and fabrication methods are used. The scope of the embodiments should be determined with reference to the appended claims, along with the full scope of equivalents to which such claims are entitled.

What is claimed herein is:

1. A process for producing a stable, fully reduced metallic nanoparticle-containing colloidal dispersion with a uniform and mean particle size less than about 5 nm which comprises the steps of:
    forming a metallic salt charge transfer complex (CT complex) of an amino alcohol or diamine moiety with a metallic salt;
    reacting the CT complex with a solution comprising a two or three nitrogen atom-containing organic reducing agent to form metallic particles; and
    stabilizing the metallic particles with aniline or a bi-dentate hetero atom containing a Lewis Base amine stabilizer to form the stable, fully reduced metallic nanoparticle-containing colloidal dispersion,
    wherein:
    the CT complex results from the reaction of a metallic formate, acetate, alkoxide or citrate salt dissolved in at least two solvents selected from the group consisting of water, monoethanolamine, di-ethanolamine, tri-ethanolamine, 1,2-aminopropanol, 1,3-aminopropanol, and combinations thereof;
    the two or three nitrogen atom containing reducing agent is selected from the group consisting of diethylenetriamine, 1,2-diaminocyclohexane, hydrazine, organic group substituted hydrazine molecule, phenidone or derived phenidone-molecule; wherein derived phenidone-molecule comprises 1-phenyl-3-pyrazolidinone and its organic derivatives having substituents other than hydrogen in the 4 and 5 positions; and the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, urea, 8-hydroxyquinoline, substituted urea, and combinations thereof.

2. The process of claim 1, wherein the at least two solvents comprise water and a solvent selected from the group consisting of monoethanolamine, di-ethanolamine, tri-ethanolamine, 1,2-aminopropanol, 1,3-aminopropanol, and combinations thereof.

3. The process of claim 1, wherein the process further comprises a step of concentrating the stable, fully reduced metallic nanoparticle-containing colloidal dispersion by removing at least a portion of a volatile low molecular weight solvent.

4. The process of claim 3, wherein the solvent is removed by a process selected from the group consisting of partial vacuum distillation, ultrafiltration, chemical extraction into another phase, complexation and combinations thereof.

5. The process of claim 3, wherein the low molecular weight solvent is a low molecular weight solvent selected from the group consisting of water, methanol, ethanol, ethanolamine, monoethanol amine, di-ethanol amine, tri-ethanol amine, methoxy propanol, 1-amino 2-propanol, 1-amino 3-propanol, 1,2-diamino propane, 1,3-diamino propane and combinations thereof.

6. The process of claim 1, wherein the process is a one-pot process.

7. The process of claim 1, wherein at least one of a bidentate organic amine and diamine is present during formation of the metallic particle.

8. The process of claim 1, wherein at least one of a bidentate organic amine and diamine is introduced after metallic particles have formed by a reduction of the metal in the metallic salts to a zero oxidation state.

9. The process of claim 1, wherein a Lewis acid is introduced post reduction.

10. The process of claim 1, wherein at least one of the steps of reacting, reducing, stabilizing and concentrating occurs at a temperature less than 95 degrees Celsius.

11. The process of claim 1, wherein the reducing agent has at least two nitrogen atoms that are in spatial proximity of less than four atoms removed.

12. The process of claim 1, wherein the reducing agent has at least two nitrogen atoms adjacently located.

13. A process for producing a stable, fully reduced metallic nanoparticle-containing colloidal dispersion with a uniform and mean particle size less than about 5 nm which comprises the steps of:

forming a metallic salt charge transfer complex (CT complex) by a reaction of a metallic formate, acetate, or citrate salt dissolved in a diamine, 1,2 or 1,3-diamino propane or 1,2-diaminocyclohexane;

reacting the CT complex with a solution comprising a two or three nitrogen atom-containing organic reducing agent to form metallic particles; and stabilizing the metallic particles with aniline or a bi-dentate hetero atom containing a Lewis Base amine stabilizer to form the stable, fully reduced metallic nanoparticle-containing colloidal dispersion, wherein:

the CT complex results from the reaction of a metallic formate, acetate, alkoxide or citrate salt dissolved in at least two solvents selected from the group consisting of water, monoethanolamine, di-ethanolamine, tri-ethanolamine, 1,2-aminopropanol, 1,3-aminopropanol, and combinations thereof;

the two or three nitrogen atom containing reducing agent is selected from the group consisting of diethylenetriamine, 1,2-diaminocyclohexane, hydrazine, organic group substituted hydrazine molecule, phenidone or derived phenidone-molecule; wherein derived phenidone-molecule comprises 1-phenyl-3-pyrazolidinone and its organic derivatives having substituents other than hydrogen in the 4 and 5 positions; and the bi-dentate hetero atom-containing amine stabilizer is selected from the group consisting of dimethyl glyoxime, 2,2'-bipyridine, 1,10-phenanthroline, ortho-phenylenediamine, 1,2-diaminocyclohexane, 1,4-diamino butane, urea, 8-hydroxyquinoline, substituted urea, and combinations thereof.

* * * * *